United States Patent
Conn et al.

(10) Patent No.: US 6,882,182 B1
(45) Date of Patent: Apr. 19, 2005

(54) TUNABLE CLOCK DISTRIBUTION SYSTEM FOR REDUCING POWER DISSIPATION

(75) Inventors: Robert O. Conn, Los Gatos, CA (US); Gary R. Lawman, San Jose, CA (US); Christopher H. Kingsley, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/669,589

(22) Filed: Sep. 23, 2003

(51) Int. Cl.[7] .............................................. H03K 19/00
(52) U.S. Cl. ...................................... 326/93; 331/181
(58) Field of Search .............................. 326/26, 27, 30, 326/93–98; 331/181

(56) References Cited

U.S. PATENT DOCUMENTS

| | | | | |
|---|---|---|---|---|
| 5,539,328 A | * | 7/1996 | Mirov et al. ................ | 326/30 |
| 5,627,482 A | * | 5/1997 | Lamatsch .................... | 326/93 |
| 5,999,025 A | * | 12/1999 | New .......................... | 327/156 |
| 6,437,653 B1 | * | 8/2002 | Cruz et al. .................. | 331/181 |
| 6,539,490 B1 | * | 3/2003 | Forbes et al. ............... | 713/401 |

* cited by examiner

*Primary Examiner*—Don Le
(74) *Attorney, Agent, or Firm*—Edward S. Mao; Kim Kanzaki (57) ABSTRACT

A tunable clock distribution system is used to minimize the power dissipation of a clock distribution network in an integrated circuit. The tunable clock distribution system provides a tunable inductance on the clock distribution network to adjust a resonant frequency in the tunable clock distribution system. The inductance is tuned so that the resonant frequency of the tunable clock distribution system approaches the frequency of the clock signal on the clock distribution network. As the resonant frequency of the tunable clock distribution system approaches the frequency of the clock signal, the power dissipation of the clock distribution network decreases. Some embodiments also provide a tunable capacitance on the clock distribution network to adjust the resonant frequency of the tunable clock distribution system.

23 Claims, 6 Drawing Sheets

TUNABLE CLOCK DISTRIBUTION SYSTEM FOR REDUCING POWER DISSIPATION

FIELD OF THE INVENTION

The present invention relates to integrated circuits using clock signals. More specifically, the present invention relates to tunable clock distribution circuits for reducing the power dissipation of a clock distribution network.

BACKGROUND OF THE INVENTION

Figure 1:
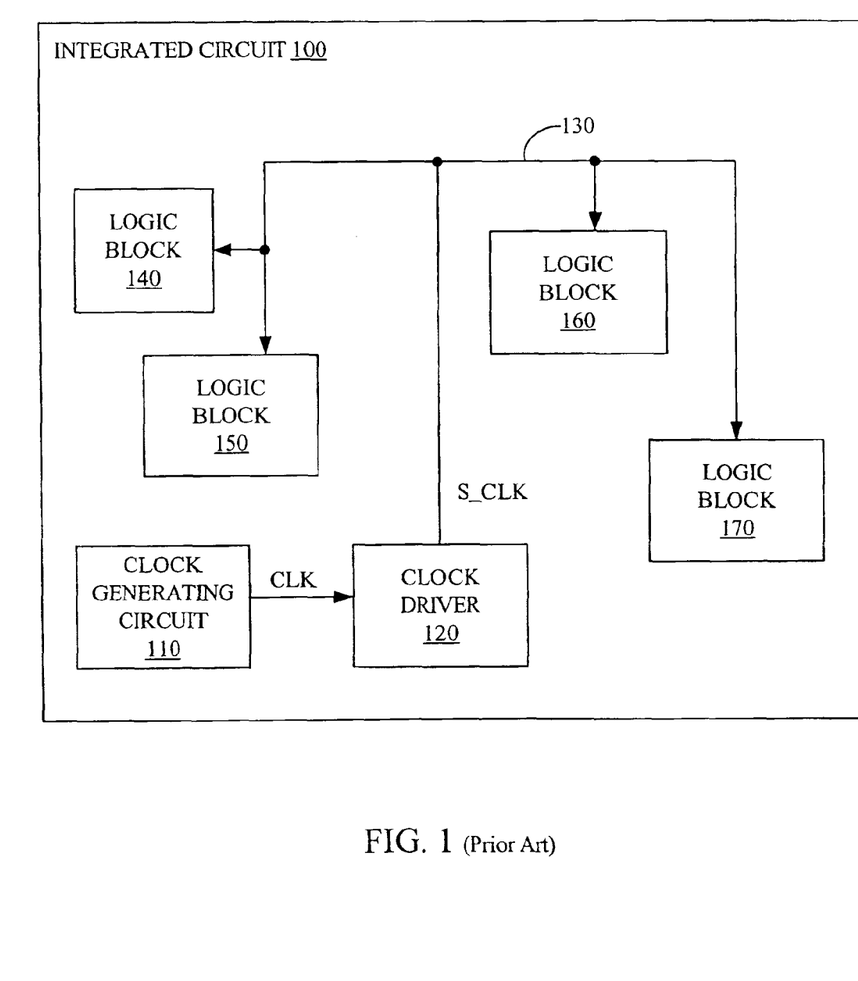
FIG. 1 is a block diagram of an integrated circuit using a conventional clock distribution network.

Synchronous integrated circuits (IC) rely on one or more clock signals to synchronize elements across the integrated circuit. Typically, one or more clock signals are distributed across the system on one or more clock distribution networks. FIG. 1 illustrates a typical synchronous IC 100, which can be for example, a microprocessor, a programmable logic device (PLD) such as a field programmable gate array (FPGA), a digital signal processor, or a graphics controller. Specifically, synchronous IC 100 has a clock generating circuit 110, a clock driver 120, and a clock distribution network 130, and logic blocks 140, 150, 160, and 170. Specifically, clock generating circuit 110 drives a clock signal CLK to clock driver 120. In some integrated circuits, clock signal CLK is provided from an external clock generating circuit. Clock driver 120 amplifies clock signal CLK to drive a system clock signal S_CLK to logic blocks 140–170 on clock distribution network 130. Logic blocks 140–170 perform various logic functions using system clock signal S_CLK.

A common way to increase the performance of synchronous IC 100 is to increase the frequency of system clock signal S_CLK (and clock signal CLK) on clock distribution network 130. If logic blocks 140–170 can accommodate an increased clock frequency, the performance of integrated circuit 100 is directly proportional to the clock frequency. Thus, doubling of the frequency of system clock signal S_CLK doubles the performance of synchronous IC 100.

However, increasing the frequency of clock signal S_CLK greatly increases the power consumption of synchronous IC 100. As shown in equation (1), $P_f$ the frequency dependent component of the power, dissipated by clock distribution network 130 is equal to the capacitance C_net on clock distribution network 130 multiplied by the square of the voltage swing between logic low (typically 0) and logic high (typically V) multiplied by the frequency F of system clock signal S_CLK.

$$P_f = C\_net * V^2 * F \qquad (1)$$

Power dissipation in integrated circuits is typically in the form of heat. Excess heat may damage integrated circuits, thus additional costly cooling systems may be required for a high frequency integrated circuit. Furthermore, many integrated circuits are used in portable systems, such as laptop computers, which have limited battery life. To extend the battery life of portable systems, integrated circuit must minimize power dissipation. Thus, there is a need for a circuit or a method to minimize power dissipation on high frequency clock distribution networks in integrated circuits.

SUMMARY

The present invention provides a tunable clock distribution system with an adjustable resonant frequency in an integrated circuit which is tuned towards the frequency of the clock signal on a clock distribution network. As the resonant frequency of the tunable clock distribution system approaches the clock frequency of the clock signal, the power dissipation of the clock distribution network decreases. By matching the resonant frequency of the tunable clock distribution system with the frequency of the clock signal on the clock distribution network, power dissipation of the clock distribution network is minimized.

An exemplary embodiment of the present invention provides an integrated circuit having: a clock distribution network; and an inductance control circuit coupled to the clock distribution network and receiving a clock signal, where the inductance control circuit, hating an inductance, is configured to provide a resonant frequency of the clock distribution network as a function of a clock frequency of the clock signal.

In accordance with another embodiment of the present invention, the tunable clock distribution system includes an inductance control circuit. The inductance control circuit includes multiple controllable inductance circuits. Each controllable inductance circuit includes an inductor coupled to the clock distribution network, a switchable bypass circuit coupled in parallel with the inductor, and a control circuit for the switchable bypass circuit. A controllable inductance circuit is activated to add inductance to the clock distribution network by switching the switchable bypass circuit to a non-conductive state. Conversely, a controllable inductance circuit is deactivated to not add inductance to the clock distribution network by switching the switchable bypass circuit to conductive state.

In some embodiments of the present invention, the tunable clock distribution system includes one or more capacitance control circuits coupled between the clock distribution network and ground. In a specific embodiment of the capacitance control circuit, a capacitor and pass gate are coupled in series between the clock distribution network and ground. A pass gate control circuit, such as a configuration memory cell, controls the pass gate. To add capacitance to the clock distribution network, the pass gate is switched to a conductive state. By controlling the capacitance and inductance of the clock distribution network, the resonant frequency of the tunable clock distribution system can be closely matched to the frequency of the clock signal on the clock distribution network. A close matching between the resonant frequency of the tunable clock distribution system and the frequency of the clock signal results in lower power dissipation by the clock distribution network. The present invention will be more fully understood in view of the following description and drawings.

BRIEF DESCRIPTION OF THE DRAWINGS

FIG. 2-1 is a block diagram of a tunable clock distribution circuit in accordance with a second embodiment of the present invention.

DETAILED DESCRIPTION

Figure 2:
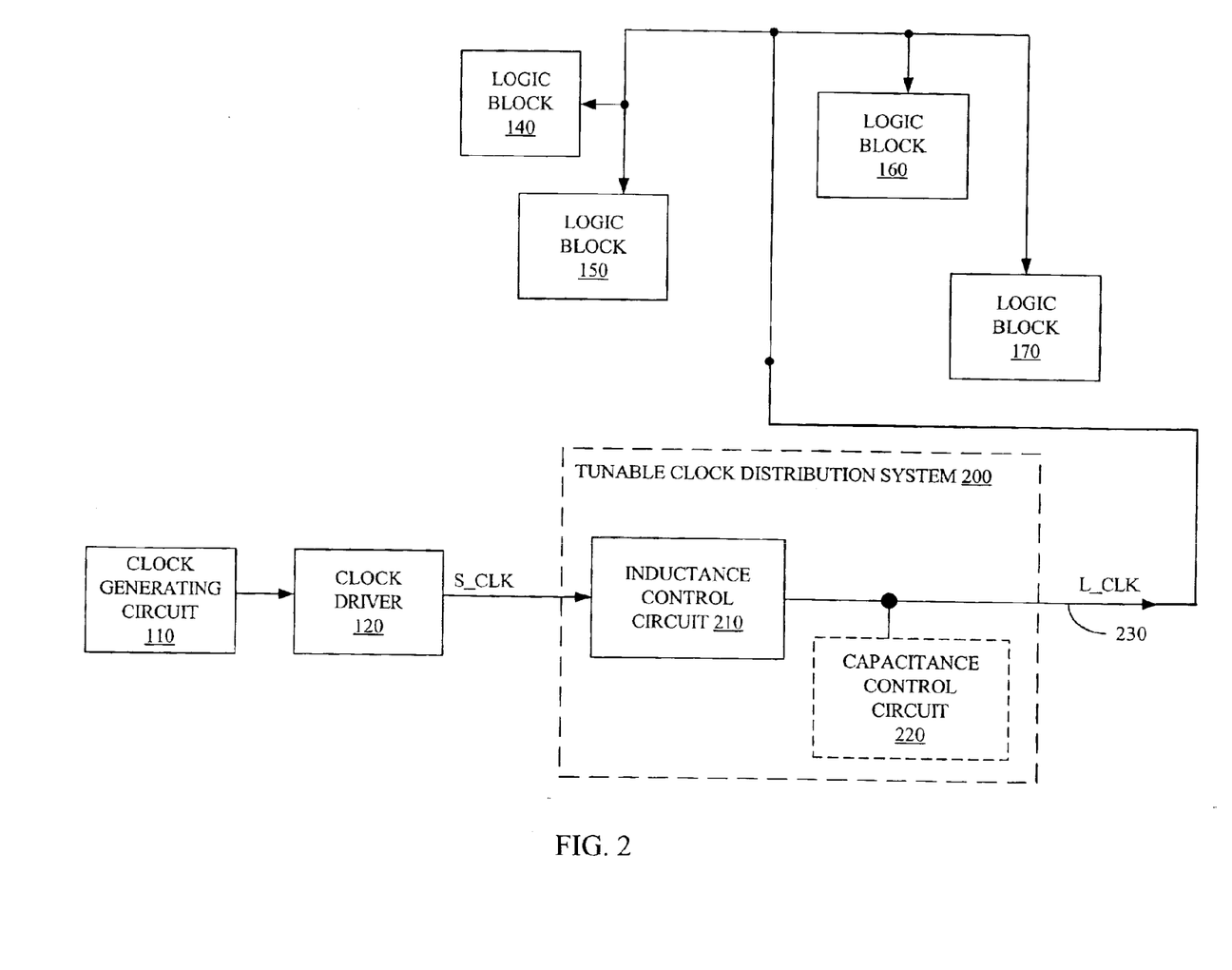
FIG. 2 is a block diagram of a tunable clock distribution circuit in accordance with one embodiment of the present invention.

FIG. 2 is a block diagram of a tunable clock distribution system 200 in accordance with one embodiment of the present invention. Tunable clock distribution circuit 200 is coupled to clock driver 120 which is coupled to clock generating circuit 110. Tunable clock distribution circuit 200 includes clock distribution network 230, an inductance control circuit 210 and an optional capacitance control circuit 220. Specifically, clock driver 120 drives system clock signal S_CLK through inductance control circuit 210 onto a clock distribution network 230, where clock distribution network 230 distributes a clock signal (L_CLK) to logic blocks 140–170, that may be part of a FPGA. For clarity, the clock signal on clock distribution network 230 after inductance control circuit 210 is referred to as inducted clock signal L_CLK. Optional capacitance control circuit 220 is coupled between clock distribution network 230 and ground.

Inductance control circuit 210 is configured to adjust the combined impedance of tunable clock distribution system 200, i.e. the impedance of inductance control circuit 210, clock distribution network 230, and capacitance control circuit 220. Specifically, inductance control circuit 210 adds a tunable inductance L_tune on clock distribution network 230. By adding tunable inductance L_tune on clock distribution network 230, tunable clock distribution system 200 has a resonant frequency F_r as explained below. Tunable inductance L_tune adjusts resonant frequency F_r of tunable clock distribution system 200 to equal the clock frequency F_clk of system clock signal S_CLK. Clock frequency F_clk of system clock signal S_CLK is the same as the frequency of inducted clock signal L_CLK. Capacitance control circuit 220, which may be included in some embodiments of the present invention, also adjusts the impedance of tunable clock distribution system 200 by adding a tunable capacitance C_tune to clock distribution network 230. Specifically, tunable capacitance C_tune is used to adjust resonant frequency F_r of tunable clock distribution system 200 to equal the clock frequency F_clk of system clock signal S_CLK.

Figure 21:
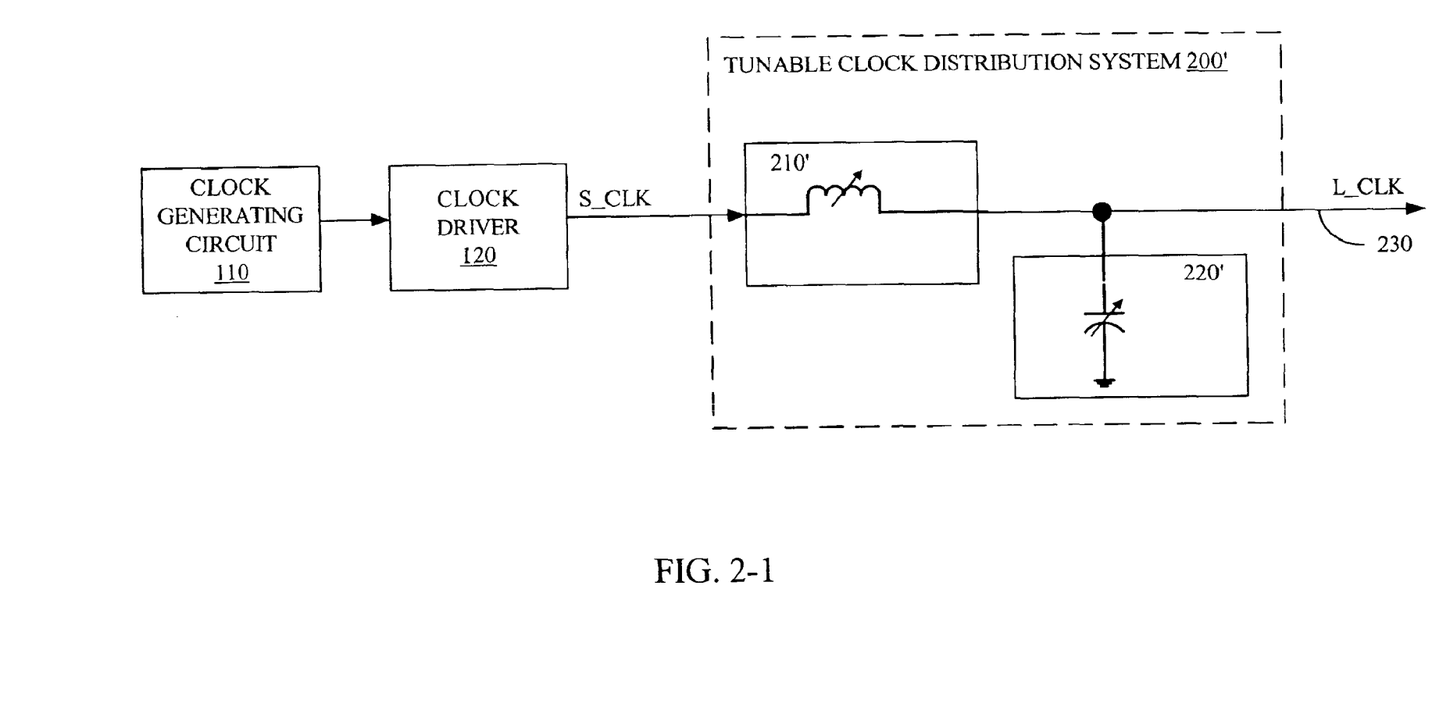

FIG. 2-1 is a block diagram of a tunable clock distribution circuit 200' in accordance with a second embodiment of the present invention. FIG. 2-1 is similar to FIG. 2 and the same labels are used were the blocks are the same. Inductance control circuit 210' includes a variable or adjustable inductance and is connected between S_CLK and L_CLK. Capacitance control circuit 220' has a variable or adjustable capacitor and is connected between L_CLK and ground. Hence the variable or adjustable inductor and/or capacitor form a tunable LC circuit which may be used to adjust the resonant frequency of clock distribution network 230 to match, for example, the frequency of S_CLK.

With reference back to FIG. 2, by including inductance control circuit 210 and capacitance control circuit 220, tunable clock distribution system 200, like clock distribution system 200' in FIG. 2-1, behaves like a resistive/inductive/capacitive (RLC) circuit. Specifically, the inherent resistance of clock distribution network 230 is the equivalent resistance R of the RLC circuit. The inductance of clock distribution network 230 combined with the additional inductance (i.e., inductance L_tune) provided by inductance control circuit 210 is the equivalent inductance L of the RLC circuit and the capacitance of clock distribution network 230 combined with the additional capacitance provided by capacitance control circuit 220 (i.e. tunable capacitance C_tune) is the equivalent capacitance C of the RLC circuit. For clarity, the total capacitance on clock distribution network 230 is referred to as capacitance C_net.

As shown in equation (2), the resonant frequency F_r of a RLC circuit is equal to one over 2 times*times the square root of the inductance L multiplied by the capacitance C of the RLC circuit, i.e.:

$$F\_r = \frac{1}{2\pi\sqrt{LC}} \quad (2)$$

As shown in equation (3), when an RLC circuit is driven at the resonant frequency of the RLC circuit, the power dissipation of the RLC circuit is equal to the integral over time of the absolute value of the current I in the inductor of the RLC circuit multiplied by the resistance R of the RLC circuit, which is equal to the current I multiplied by the square of the resistance R.

$$P = \int |1R|\partial t = IR^2 \quad (3)$$

Thus, in an RLC circuit driven at the resonant frequency F_r of the RLC circuit, the power dissipated does not depend on the frequency or the capacitance of the RLC circuit.

Thus, the power dissipation of clock distribution network 230 can be minimized by configuring inductance control circuit 210 and capacitance control circuit 220 so that resonant frequency F_r of tunable clock distribution system 200 is equal to clock frequency F_clk of system clock signal S_CLK. In general, the power dissipated by clock distribution network 230 decreases as resonant frequency F_r of tunable clock distribution system 200 is adjusted towards clock frequency F_clk of system clock signal S_CLK. Power dissipation is minimized if a perfect match of resonant frequency F_r of tunable clock distribution system 200 with clock frequency F_clk of system clock signal S_CLK is achieved. Because resonant frequency F_r is dependent equivalently on both tunable inductance L_tune and network capacitance C_net of clock distribution network 230, many embodiments of the present invention do not include capacitance control circuit 220. These embodiments instead rely on the capacitance caused by the coupling of clock distribution network 230 to various logic blocks, such as logic blocks 140–170 of FIG. 1.

Figure 3A:
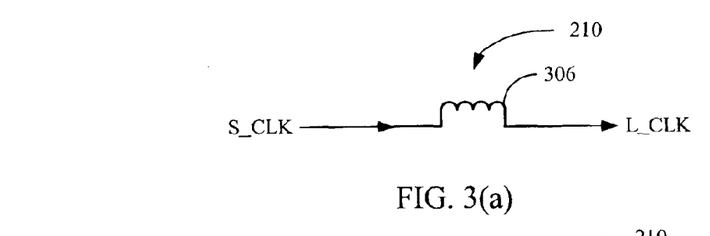
FIG. 3(a) is a schematic diagram of an inductance control circuit in accordance with one embodiment of the present invention.

Many integrated circuits are designed and manufactured for use at a specific frequency. For these integrated circuits, inductance control circuit 210 can be an inductor 306 (FIG. 3(a)) having a fixed inductance L_match. Thus, tunable inductance L_tune is equal to inductance L_match. The value of inductance L_match can be determined using equation (3).

$$L\_match = \frac{1}{(2\pi F\_clk)^2 C\_net} \quad (3)$$

Specifically L_match is equal to 1 divided by network capacitance C_net multiplied by the square of 2 times*times clock frequency F_clk of system clock signal S_CLK. For integrated circuits with fixed routing and configurations, capacitance C_net of clock distribution network 230 can be calculated using conventional design and layout tools. While process variations may cause capacitance C_net of clock distribution network 230 to vary between different instances of the integrated circuit, the resonant frequency of tunable clock distribution system 200 is closer to clock frequency F_clk of system clock signal S_CLK in an instance of the integrated circuit including inductance control circuit 210 than in instances of the integrated circuit not using inductance control circuit 210. Therefore, power dissipation in instances of an integrated circuit using inductance control circuit 210 is less than the power dissipation in instances of the integrated circuit not using inductance control circuit 210.

Figure 3B:
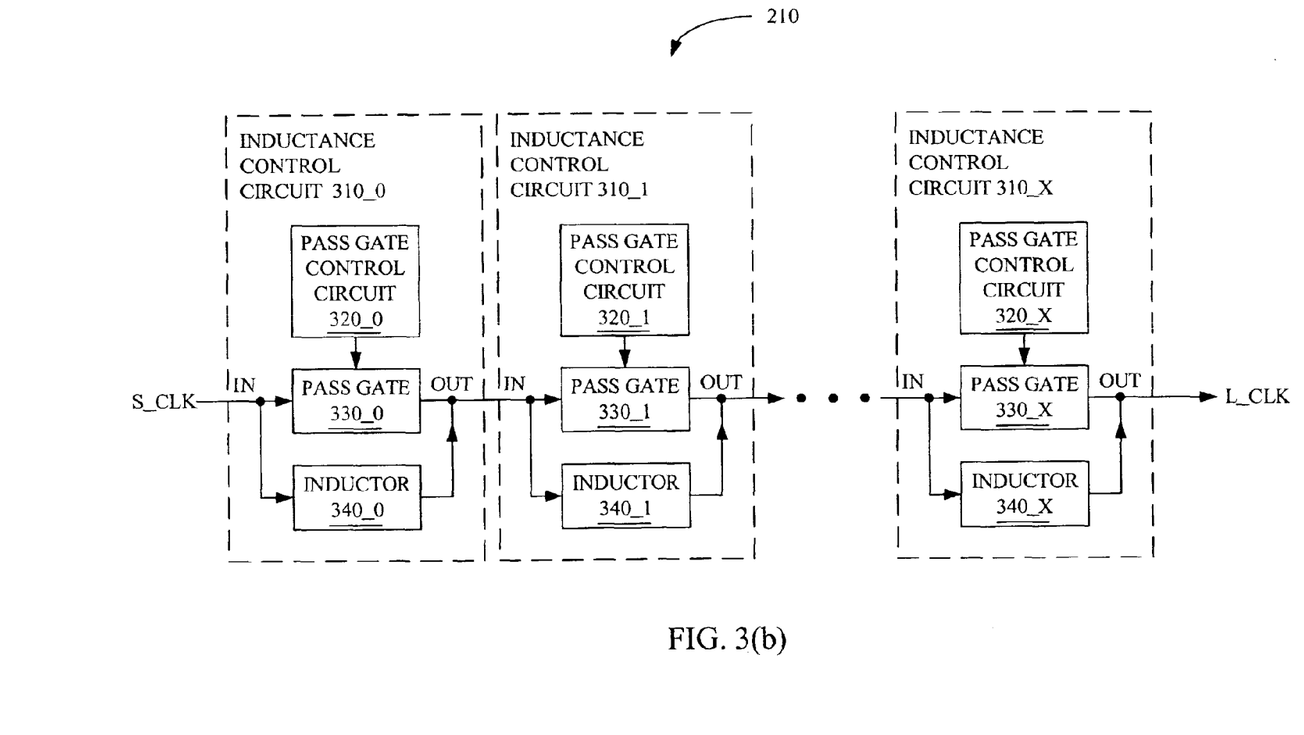
FIG. 3(b) is a schematic diagram of multiple inductance control circuits in accordance with one embodiment of the present invention.

Some integrated circuits may be used over a range of frequencies. For example, instances of a FPGA may be used by end users at many different clock frequencies. Furthermore, some integrated circuits, such as FPGAs, are re-configurable. Each configuration of the FPGA may cause network capacitance C_net of clock distribution network 230 to change. For these integrated circuits, the inductance provided by inductance control circuit 210 must change to match the specific value of clock frequency F_clk and network capacitance C_net in each instance of the integrated circuit. FIG. 3(b) is a schematic diagram of an embodiment of multiple inductance control circuits that can be tuned to provide different values for tunable inductance L_tune. Specifically, the embodiment of FIG. 3(b) comprises one or more inductance control circuits 310_0 to 310_X, where X is a positive integer. Inductance control circuit 310_0 has an input terminal IN coupled to receive system clock signal S_CLK. Inductance control circuit 310_X has an output terminal OUT coupled to drive inducted clock signal L_CLK. Each inductance control circuit 310_Y has an input terminal IN coupled to an output terminal OUT of inductance control circuit 310_(Y+1), where Y is an integer between 1 and X–1. Each inductance control circuit 310_Y also has an output terminal OUT coupled to input terminal IN of inductance control circuit 310_(Y+1). Each inductance control circuit 310_Z can be individually activated to add an inductance L_Z to clock distribution network 230 or deactivated to not add inductance to clock distribution network 230. Thus, as stated in equation (4), tunable inductance L_tune provided by tunable clock distribution circuit 200 is the sum of the inductances from the subset of inductance control circuits 310_Z, which are activated. In equation (4), A_i is equal to one if inductance control circuits 310_i is activated, otherwise A_i is equal to zero.

$$L\_tune = \sum_{i=0}^{X} A\_i * L\_i \qquad (4)$$

In the embodiment of FIG. 3(b), each inductance control circuit 310_Z, includes a pass gate control circuit 320_Z, a pass gate 330_Z, and an inductor 340_Z, where Z is an integer between 0 and X, inclusive. Pass gate 330_Z and inductor 340_Z are coupled in parallel between input terminal IN and output terminal OUT of inductance control circuit 310_Z. Pass gate 330_Z is controlled by pass gate control circuit 320_Z. If inductance control circuit 310_Z is activated, pass gate control 320_Z switches pass gate 330_Z to a non-conductive state. Therefore, input terminal IN and output terminal OUT are coupled by only inductor 340_Z and thus inductance control circuit 310_Z provides an inductance L_Z on clock distribution network 230.

Conversely, if inductance control circuit 310_Z is deactivated, pass gate control circuit 320_Z switches pass gate 330_Z to a conductive state, which provides a very low impedance path between input terminal IN and output terminal OUT. The very low impedance path through pass gate 330 is in parallel with inductance 340_Z. Consequently, inductor 340_Z is bypassed and does not provide inductance onto clock distribution network 230. Thus, pass gate 330_Z acts as a switchable bypass circuit for inductor 340_Z. Other embodiments may use other circuits, such as switchable buffers and transmission gates, in place of pass gate 330_Z for the switchable bypass circuit. Also while inductance control circuits 310_0 to 320_X are shown as series connected in FIG. 3(b), in other embodiments these inductance control circuits may be connected in parallel or series or nay combination thereof.

In yet another embodiment of the present invention, an FPGA has a single inductance control circuit 310_0 connecting system clock S_CLK to L_CLK. Pass Gate 330_0 is replaced with a CMOS transistor whose gate is connected to pass gate control circuit 320_0 and whose drain and source connect IN to OUT of inductance control 310_0. Pass gate control circuit 320_0 is a configuration memory cell that may be set to logic 0 or 1, when the FPGA is configured or reconfigured. If the CMOS transistor is an NMOS transistor, and the configuration memory cell is set to 1, the inductor 340_0 is bypassed. If the configuration memory cell is set to 0, the inductor 340_0 adds inductance to the clock distribution network. In a variation to this embodiment, the pass_gate 330_0 is replaced by a tri-state buffer connected in series to an inverter. The control input into the tri-state buffer is connected to a configuration memory cell to control whether or not the inductor 340_0 is bypassed.

In one embodiment of the present invention, inductance L_Z of each inductor 340_Z is equal to a base inductance value L_B. Thus, inductance control circuit 210 can provide a tunable inductance L_tune between 0 and X*L_B. In another embodiment of the present invention, each inductor 340_Z has an inductance value L_Z equal to a base inductance L_B multiplied by two to the power of Z (see equation (5)).

$$L\_Z = L\_B 2^Z \qquad (5)$$

For this embodiment, inductance control circuit 210 can provide a tunable inductance L_tune between 0 and L_B* $(2^{(X+1)}-1)$. Thus, for example, by using seven inductors, inductance control circuit 210 can provide a tunable inductance between 0 and 127 times base inductance L_B. The necessary tunable inductance L_tune can be determined using the frequency F of system clock signal S_CLK and network capacitance C_net of clock distribution network 230, which can be determined using conventional design and routing tools. The value of base inductance L_B is determined by the frequency range and the capacitance range of the integrated circuit.

Many conventional circuits can be used for pass gate control circuits 320_0–320_X. For example, in an FPGA each pass gate control circuit 320_Z can be a configuration memory cell. In some integrated circuits, pass gate control circuit 320_0–320_X can be memory cells, decoded memory cells, flip-flops, logic gates, fuses, anti-fuses, or external signals received from package pins.

As explained above, some embodiments of tunable clock distribution circuit 200 include capacitance control circuit 220 (FIG. 2). Capacitance control circuit 220 is used to increase network capacitance C_net on clock distribution network 230. For clarity, tunable capacitance C_tune refers to the capacitance provided by capacitance control circuit 220, capacitance C_norm is the capacitance on clock distribution network 230 without capacitance control circuit 220, and network capacitance C_net refers to the total capacitance on clock distribution network 230. Thus, network capacitance C_net is equal to tunable capacitance C_tune plus capacitance C_norm. Thus, equation (3) given above is applicable to embodiments of the present invention using capacitance control circuit 220. However, the presence of capacitance control circuit 220 allows tuning of resonant frequency F_r of tunable clock distribution system 200 using both capacitive elements and inductive elements. Although only one capacitance control circuit 220 is shown in FIG. 2, some embodiments of the present invention use multiple capacitance control circuits (see FIG. 4(b)). The multiple capacitance control circuits can be distributed at multiple points of clock distribution network 230. Also while capacitance control circuits 410_0 to 410_X are shown as connected in parallel in FIG. 4(b), in other embodiments these capacitance control circuits may be connected in parallel or series or any combination thereof.

Figure 4A:
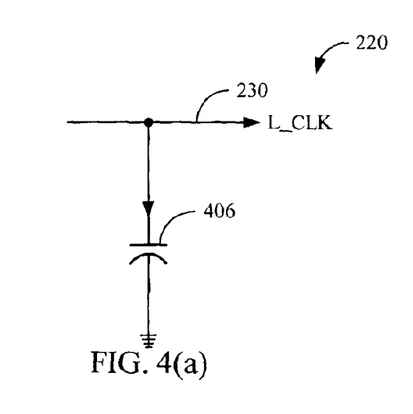
FIG. 4(a) is a schematic diagram of a capacitance control circuit in accordance with one embodiment of the present invention.

FIG. 4(a) illustrates an embodiment of capacitance control circuit 220 applicable for integrated circuits, which are designed and manufactured for use at a specific frequency. Specifically, a capacitor 406 having a fixed capacitance C_match is coupled between clock distribution network 230 and ground. The value of capacitance C_match, which is equal to tunable capacitance C_tune, is selected so that capacitance C_net satisfies equation (3).

Figure 4B:
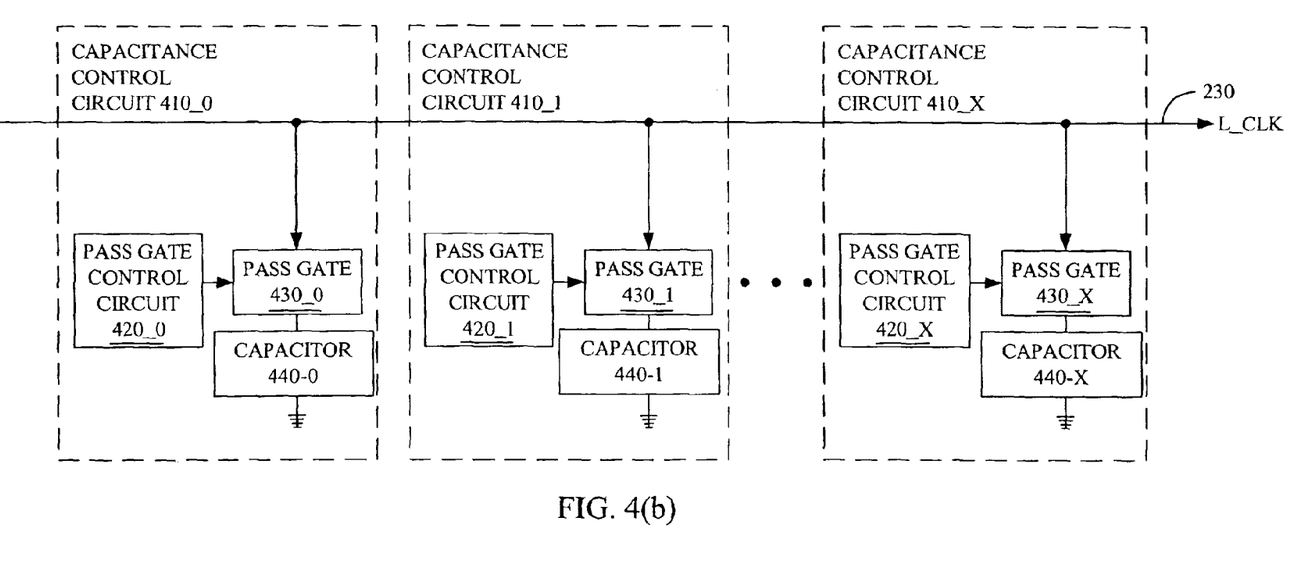
FIG. 4(b) is a schematic diagram of multiple capacitance control circuits in accordance with one embodiment of the present invention.

For integrated circuits, which may be used over a range of frequencies or are re-configurable. Multiple capacitance control circuits may be used to control capacitance C_net of clock distribution network 230. As illustrated in FIG. 4(b), capacitance control circuits 220_0 to 220_X are coupled to clock distribution network 230. Each capacitance control circuit 220_Z can be activated to provide a capacitance C_Z on clock distribution network 230 or deactivated to provide no additional capacitance to clock distribution network 230. Thus, as stated in equation (6), tunable capacitance C_tune is the sum of the capacitances from the subset of capacitance control circuits 220_Z, which are activated. In equation (4), B_i is equal to one if capacitance control circuit 210_i is activated; otherwise B_i is equal to zero.

$$C\_tune = \sum_{i=0}^{X} B\_i * C\_i \qquad (6)$$

Each capacitance control circuit 410_Z, includes a pass gate control circuit 420_Z, a pass gate 430_Z, and a capacitor 440_Z. Specifically, each pass gate 430_Z is coupled between capacitor 440_Z and clock distribution network 230. Each capacitor 440_Z is coupled between pass gate 430_Z and ground. Pass gate control circuit 420_Z controls pass gate 430_Z. If capacitance control circuit 420_Z is activated, pass gate control circuit 420_Z switches pass gate 430_Z to a conductive state. Therefore, clock distribution network 230 is coupled to ground through capacitor 440_Z, which adds an additional capacitance C_Z to clock distribution network 230. Conversely, if capacitance control circuit 410_Z is deactivated, pass gate control circuit 420_Z switches pass gate 430_Z to a non-conductive state, which isolates clock distribution network 230 capacitor 440_Z. Thus, in the deactivated state, capacitance control circuit 410_0 does not add significant capacitance to clock distribution network 230.

In one embodiment of the present invention, capacitance C_Z of each capacitor 440_Z is equal to a base capacitance C_B. Thus, capacitance control circuits 410_0 to 410_X can provide a tunable capacitance C_tune between 0 and X*C_B. In another embodiment of the present invention, each capacitor 440_Z has a capacitance C_Z equal to base capacitance C_B multiplied by two to the power of Z (see equation (7)).

$$C\_Z = C\_B * 2^Z \qquad (7)$$

For this embodiment, capacitance control circuits 410_0 to 410_X can provide a tunable capacitance C_tune between 0 and $C\_B*(2^{(X+1)}-1)$. The value of base capacitance C_B is determined by the frequency range and the capacitance range of the integrated circuit.

Figure 5:
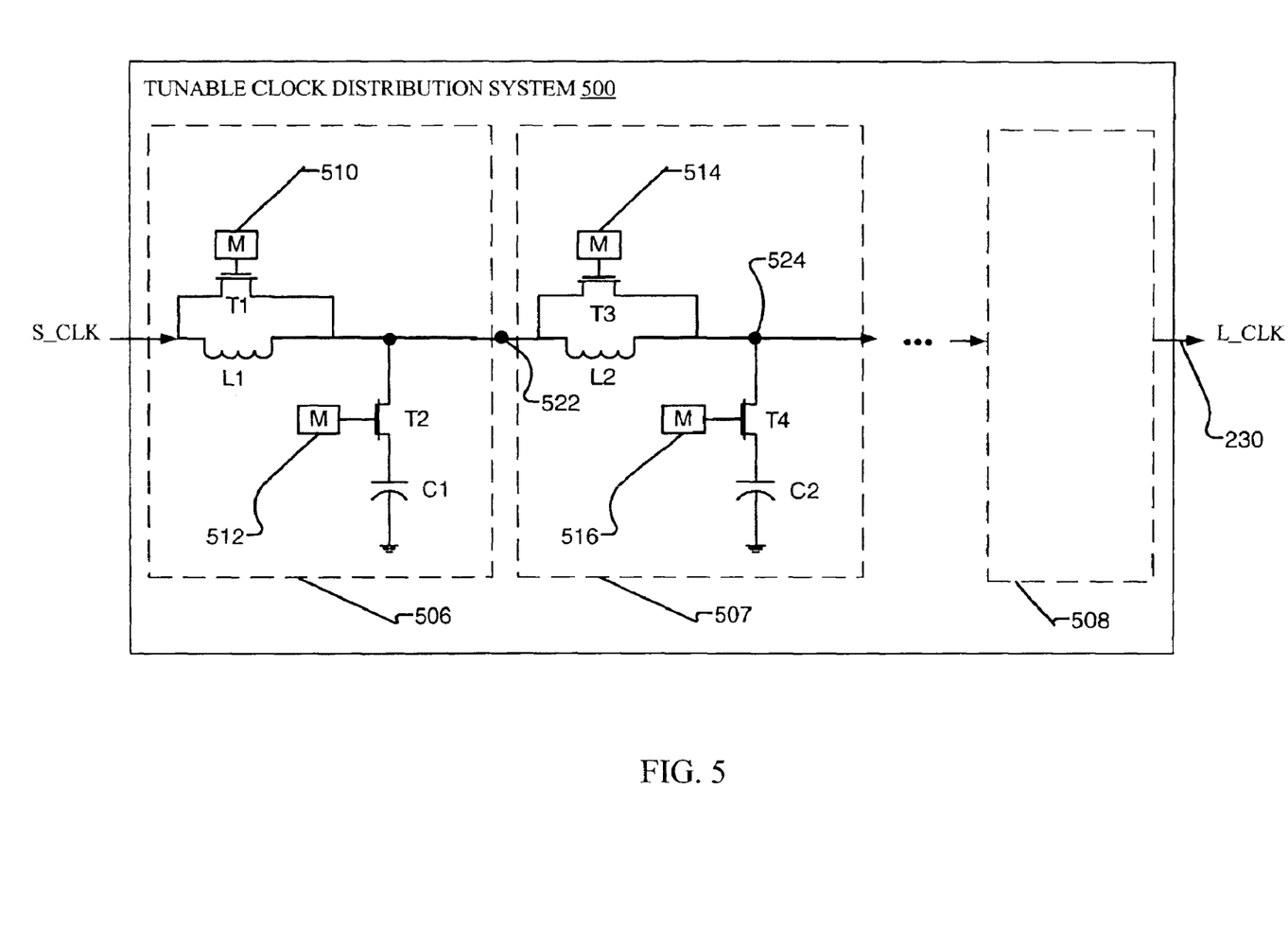
FIG. 5 is a schematic diagram of a tunable clock distribution system of an alternative embodiment of the present invention.

FIG. 5 is a schematic diagram of a tunable clock distribution system 500 of an alternative embodiment of the present invention. The tunable clock distribution system 500 receives as input system clock S_CLK and outputs L-CLK to clock distribution network 230. Tunable clock distribution system 500 is part of an FPGA with configuration memory cells such as 510, 512, 514, and 516, that are set (or reset) to 1 or 0, when the FPGA is configured or reconfigured. Tunable clock distribution system 500 has a set of one or more substantially identical blocks, e.g., blocks 506, 507, and 508.

Block 506 has input S-CLK, inductor L1, NMOS transistor T1, NMOS transistor T2, capacitor C1, configuration memory cells 510 and 512, and output node 522. Input S-CLK is connected to the inductor L1 which is connected in parallel with bypass NMOS transistor T1. The gate of transistor T1 is connected to configuration memory cell 510, which determines whether inductor L1 is bypassed or not. The inductor L1 is also connected to transistor T2 and output node 522. Transistor T2 is connected in series to capacitor C1, which in turn is connected to ground. The gate of transistor T2 is connected to configuration memory cell 512, which determines whether capacitor C1 is connected to output node 522 or not. The output node 522 of block 506 is the input to block 507. Block 507 has inductor L2, NMOS transistor T3, NMOS transistor T4, capacitor C2, configuration memory cells 514 and 516, and output node 524. The components in block 507 are connected similarly to those in block 506.

As can be seen from FIG. 5 setting configuration memory cells 510 to 0, e.g., ground, and 512 to 1, e.g., Vcc, inductance L1 and capacitance C1 is added from block 506 to clock distribution network 230. Other combinations of configuration memory cells 510 and 512, may add inductance L1 only, capacitance C1 only, or neither capacitance or inductance from block 506 to clock distribution network 230. Since block 507 is series connected with block 506 by appropriately setting or resetting configuration memory cells 514 and 516, additional inductance L2 and/or capacitance C2 may be added to that of block 506. In should be understood to those of ordinary skill in the arts that blocks 506, 507, and 508 may be connected in series, parallel, or a combination of both and that the number of blocks may be one or more (FIG. 5 only shows an illustrative number and configuration for one embodiment).

In the various embodiments of the present invention, novel structures have been described for tuning the resonant frequency F_r of a tunable clock distribution system. The tunable clock distribution circuit of embodiments of the present invention can reduce the power dissipation of a clock distribution network. Specifically, the resonant frequency F_r of the tunable clock distribution system is tuned by adding a tunable inductance L_tune and a tunable capacitance C_tune to the clock distribution network. By controlling both tunable capacitance C_tune and tunable inductance L_tune, resonant frequency F_r can be tuned to equal clock frequency F_clk of system clock signal S_CLK. Matching resonant frequency F_r with clock frequency F_clk minimizes the power dissipation of the clock distribution network.

In an alternative embodiment of the present invention the tunable clock distribution system 200 of FIG. 2, provides an adjustable inductance, an adjustable capacitance or any combination thereof, that can vary the resonance frequency of a clock distribution network. While it is desirable to substantially match the resonance frequency to frequency of the clock which is input into the tunable clock distribution system 200, in this alternative embodiment the adjustable inductance, the adjustable capacitance or any combination thereof, is adjusted so that the resonance frequency is a function of the frequency of the input clock. Where an FPGA is used the adjustable inductance and the adjustable capacitance are programmable (i.e., their inductance and capacitance may be changed by adding/removing programmable inductive and capacitive elements, respectively) by programming the configuration memory of the FPGA.

The various embodiments of the structures and methods of this invention that are described above are illustrative only of the principles of this invention and are not intended to limit the scope of the invention to the particular embodiments described. For example, in view of this disclosure those skilled in the art can define other tunable clock distribution circuits, inductance control circuits, capacitance control circuits, pass gate control circuits, controllable inductance circuits, and so forth, and use these alternative features to create a method, circuit, or system according to the principles of this invention. Thus, the invention is limited only by the following claims.

What is claimed is:

1. An integrated circuit comprising:
   a clock distribution network; and
   an inductance control circuit coupled to the clock distribution network and receiving a clock signal, wherein the inductance control circuit, comprising an inductance, is configured to provide a resonant frequency of the clock distribution network as a function of a clock frequency of the clock signal; and
   wherein the inductance of the inductance control circuit comprises:
      an inductor coupled to the clock distribution network; and
      a switchable bypass circuit coupled in parallel with the inductor.

2. The integrated circuit of claim 1, wherein the inductance provided by the inductance control circuit is adjustable.

3. The integrated circuit of claim 1, wherein the inductance of the inductance control circuit is fixed.

4. The integrated circuit of claim 1, wherein the integrated circuit is a programmable logic device.

5. The integrated circuit of claim 1, wherein the switchable bypass circuit is a pass gate.

6. The integrated circuit of claim 5, wherein the first inductance control circuit further comprises a pass gate control circuit coupled to the pass gate.

7. The integrated circuit of claim 6, wherein the pass gate control circuit is a configuration memory cell of an FPGA.

8. The integrated circuit of claim 4, further comprising a second inductance control circuit coupled to the inductance control circuit.

9. The integrated circuit of claim 8, further comprising a third inductance control circuit coupled to the second inductance control circuit, and wherein the third inductance control circuit is configurable to provide an inductance equal to a base inductance, the second inductance control circuit is configurable to provide an inductance equal to two times the base inductance, and the inductance control circuit is configurable to provide an inductance equal to four times the base inductance.

10. The integrated circuit of claim 1, further comprising a capacitance control circuit coupled between the clock distribution network and ground.

11. The integrated circuit of claim 10, wherein the capacitance control circuit comprises a capacitor coupled between the clock distribution network and ground.

12. The integrated circuit of claim 11, wherein the capacitance control circuit further comprises a pass gate coupled between the capacitor and the clock distribution network.

13. The integrated circuit of claim 12, wherein the capacitance control circuit further comprises a pass gate control circuit coupled to the pass gate.

14. The integrated circuit of claim 13 wherein the pass gate control circuit is a configuration memory cell of an FPGA.

15. The integrated circuit of claim 10 wherein the capacitance control circuit is adjustable.

16. The integrated circuit of claim 1, wherein the function is an equivalence function.

17. A method to reduce power dissipation on a clock distribution network of an integrated circuit having a clock signal on the clock distribution network, the method comprising the steps of:
   obtaining a clock frequency of the clock signal; and
   varying an adjustable inductance coupled to the clock distribution network to substantially match a resonant frequency of the clock distribution network to the clock frequency; and
   wherein the step of varying an adjustable inductance, comprises the steps of:
   activating a first subset of controllable inductance circuits; and
   deactivating a second subset of controllable inductance circuits.

18. The method of claim 17, further comprising the step of calculating a network capacitance of the clock distribution network.

19. The method of claim 17, further comprising the step of providing a capacitance on the clock distribution network.

20. An integrated circuit (IC) having programmable functions and programmable interconnections, comprising:
   a clock distribution network coupled to a clock, the clock distribution network having an adjustable resonant frequency and the clock having a clock frequency; and
   a tunable clock distribution system coupled between the clock and the clock distribution network, the tunable clock distribution system comprising a programmable inductance, wherein the programmable inductance is configured to change the adjustable resonant frequency to approach the clock frequency; and
   wherein the tunable clock distribution system further comprises a programmable capacitance.

21. The IC of claim 20, wherein the programmable capacitance is programmed using a configuration memory cell in the IC.

22. The IC of claim 20, wherein the programmable inductance is programmed using a configuration memory cell in the IC.

23. An integrated circuit comprising:

a clock distribution network; and an inductance control circuit coupled to the clock distribution network and receiving a clock signal, wherein the inductance control circuit, comprising an inductance, is configured to provide a resonant frequency of the clock distribution network as a function of a clock frequency of the clock signal; and further comprising a capacitance control circuit coupled between the clock distribution network and ground; and wherein the capacitance control circuit comprises a capacitor coupled between the clock distribution network and ground.

* * * * *